(12) United States Patent
Yang et al.

(10) Patent No.: US 12,119,319 B2
(45) Date of Patent: Oct. 15, 2024

(54) ELECTRONIC DEVICES AND METHODS OF MANUFACTURING ELECTRONIC DEVICES

(71) Applicant: Amkor Technology Singapore Holding Pte. Ltd., Valley Point #12-03 (SG)

(72) Inventors: Ki Yeul Yang, Seoul (KR); Eun Taek Jeong, Incheon (KR); Du Young Lee, Gyenoggi-do (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 114 days.

(21) Appl. No.: 17/549,810

(22) Filed: Dec. 13, 2021

(65) Prior Publication Data
US 2023/0187400 A1    Jun. 15, 2023

(51) Int. Cl.
*H01L 23/498* (2006.01)
*H01L 23/00* (2006.01)
*H01L 23/31* (2006.01)

(52) U.S. Cl.
CPC .......... *H01L 24/16* (2013.01); *H01L 23/3157* (2013.01); *H01L 23/49811* (2013.01); *H01L 23/49822* (2013.01); *H01L 23/49894* (2013.01); *H01L 24/32* (2013.01); *H01L 24/73* (2013.01); *H01L 2224/16227* (2013.01); *H01L 2224/32225* (2013.01); *H01L 2224/73204* (2013.01)

(58) Field of Classification Search
CPC ................. H01L 24/16; H01L 23/3128; H01L 23/49816; H01L 24/13
See application file for complete search history.

(56) References Cited

U.S. PATENT DOCUMENTS

| | | | | |
|---|---|---|---|---|
| 2006/0131730 | A1* | 6/2006 | Nakamura | H05K 3/4007 257/E23.068 |
| 2013/0250533 | A1* | 9/2013 | Kodani | H05K 1/181 361/767 |
| 2014/0273436 | A1* | 9/2014 | Hintze | H01L 21/76856 438/653 |
| 2014/0361431 | A1* | 12/2014 | Matsumoto | H01L 24/11 257/737 |
| 2017/0372997 | A1* | 12/2017 | Tsukamoto | H01L 21/4857 |
| 2021/0217684 | A1* | 7/2021 | Shih | H01L 21/76807 |
| 2021/0305086 | A1* | 9/2021 | Yu | H01L 23/5383 |
| 2023/0019311 | A1* | 1/2023 | Kim | H01L 23/49816 |

FOREIGN PATENT DOCUMENTS

CN    101728347 B  *  5/2011  .............. H01L 24/11

* cited by examiner

*Primary Examiner* — Michele Fan
(74) *Attorney, Agent, or Firm* — Kevin B. Jackson

(57) ABSTRACT

In one example, an electronic device includes a substrate, which has a dielectric structure includes a dielectric structure top side and a dielectric structure bottom side opposite to the dielectric structure top side, and a conductive structure comprising a protruded via that extends from the dielectric structure bottom side. An electronic component is coupled to the conductive structure at the dielectric structure top side, and a terminal is coupled to the protruded via such that the protruded via extends into the terminal. Other examples and related methods are also disclosed herein.

23 Claims, 14 Drawing Sheets

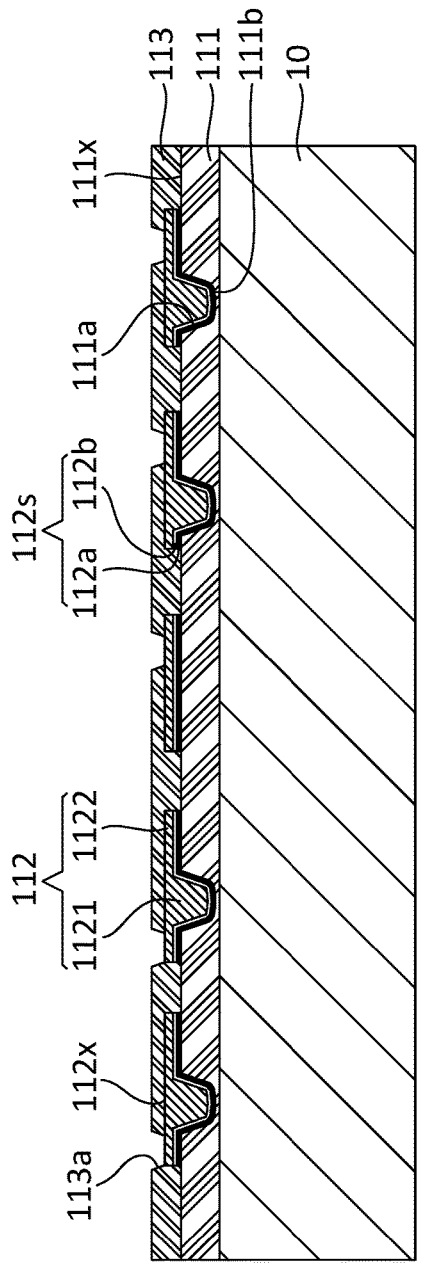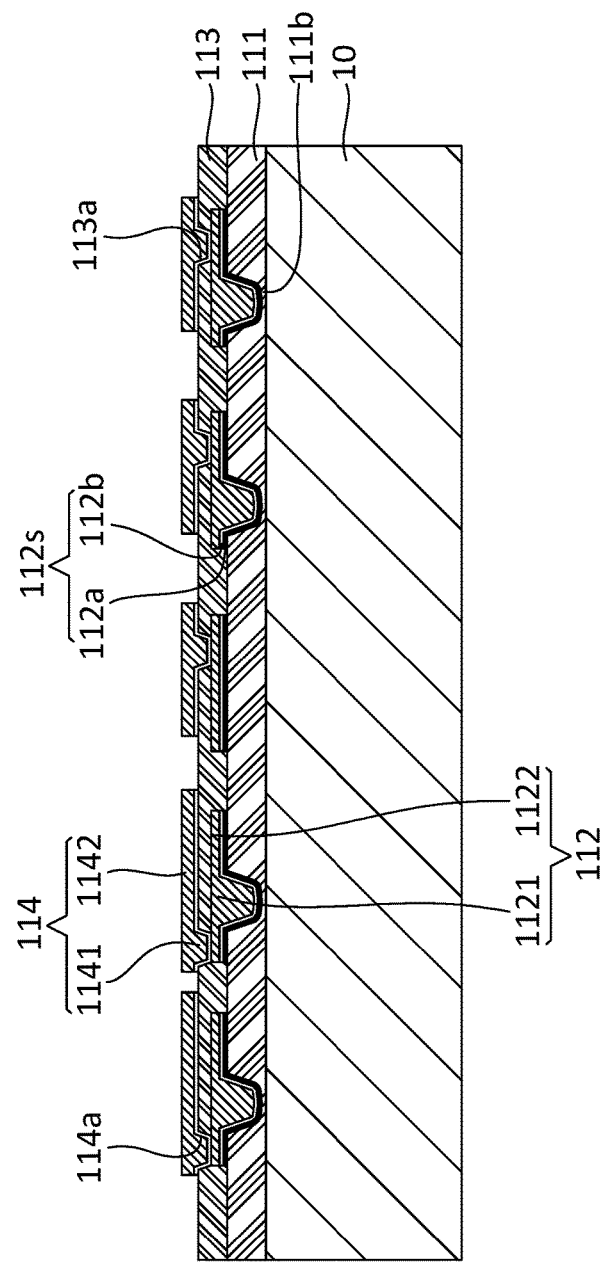

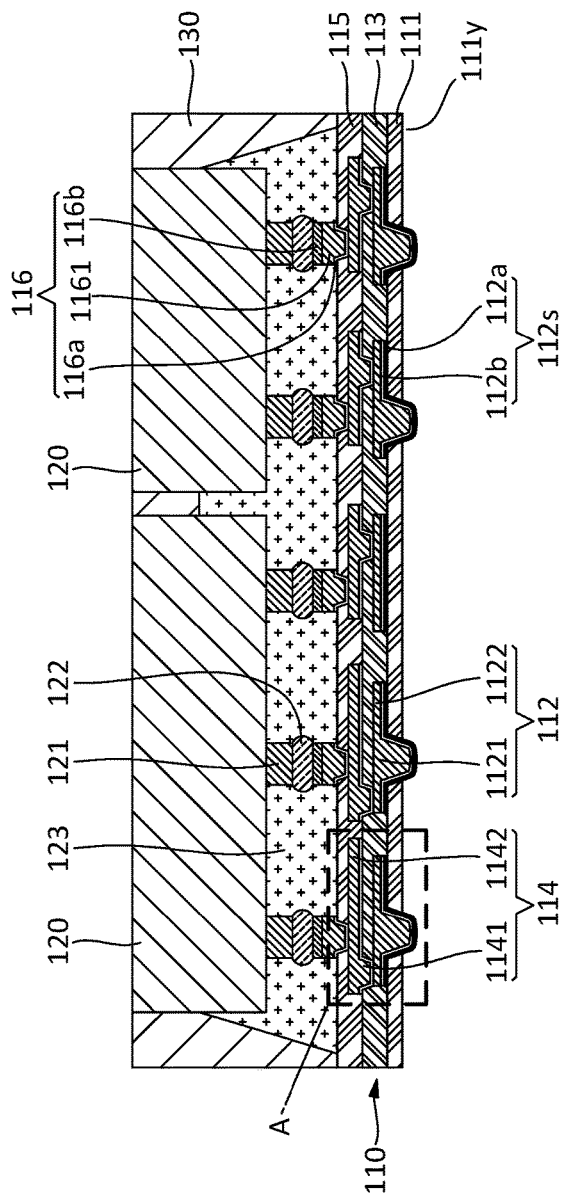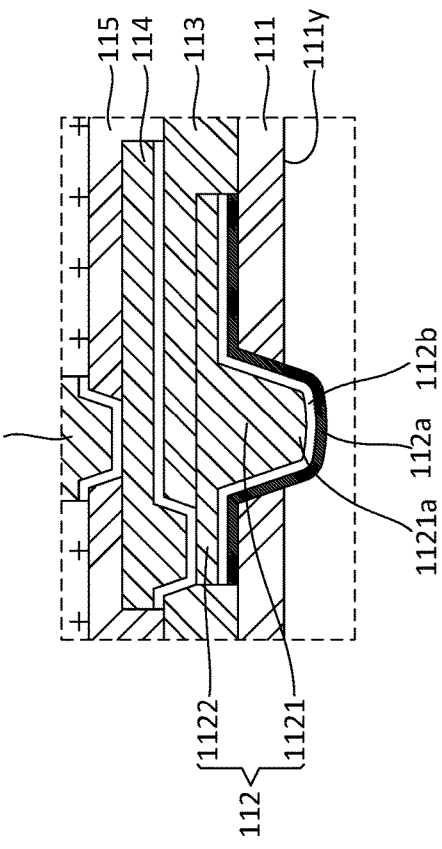

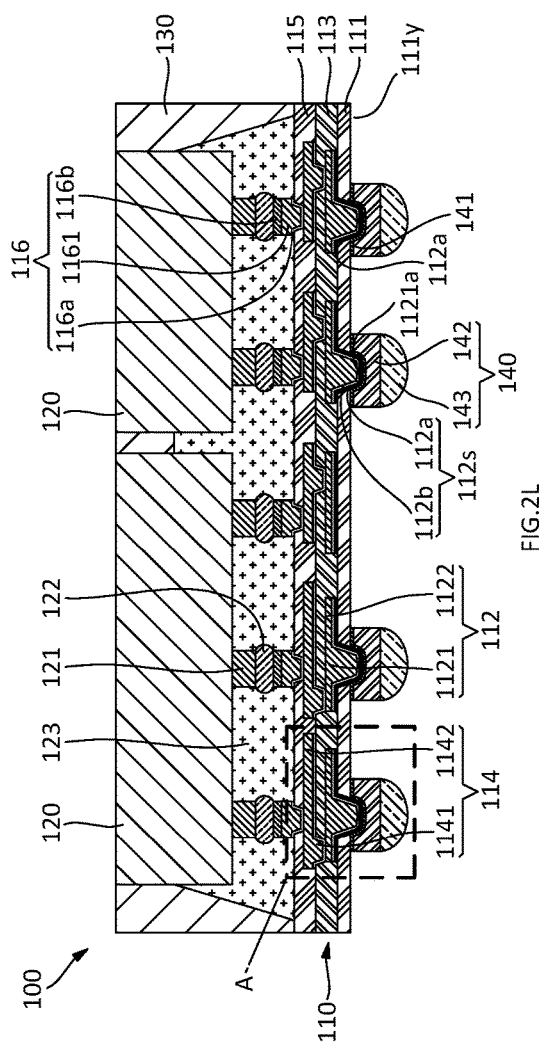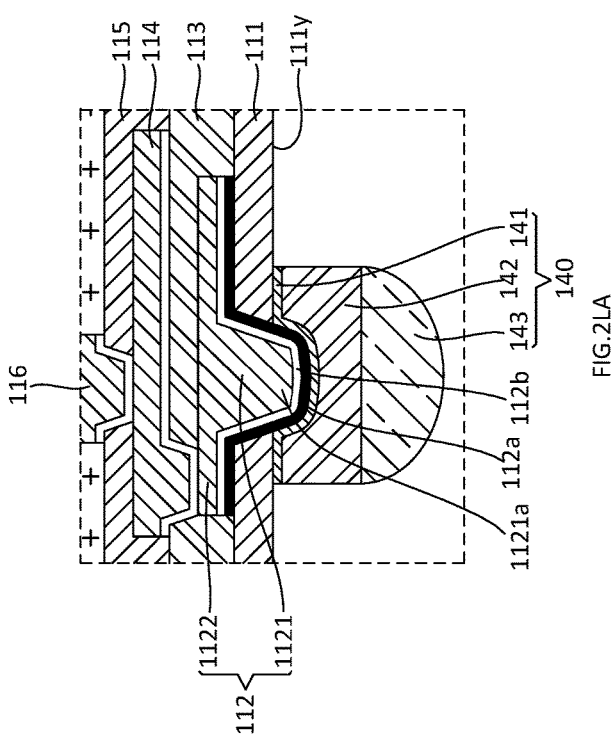

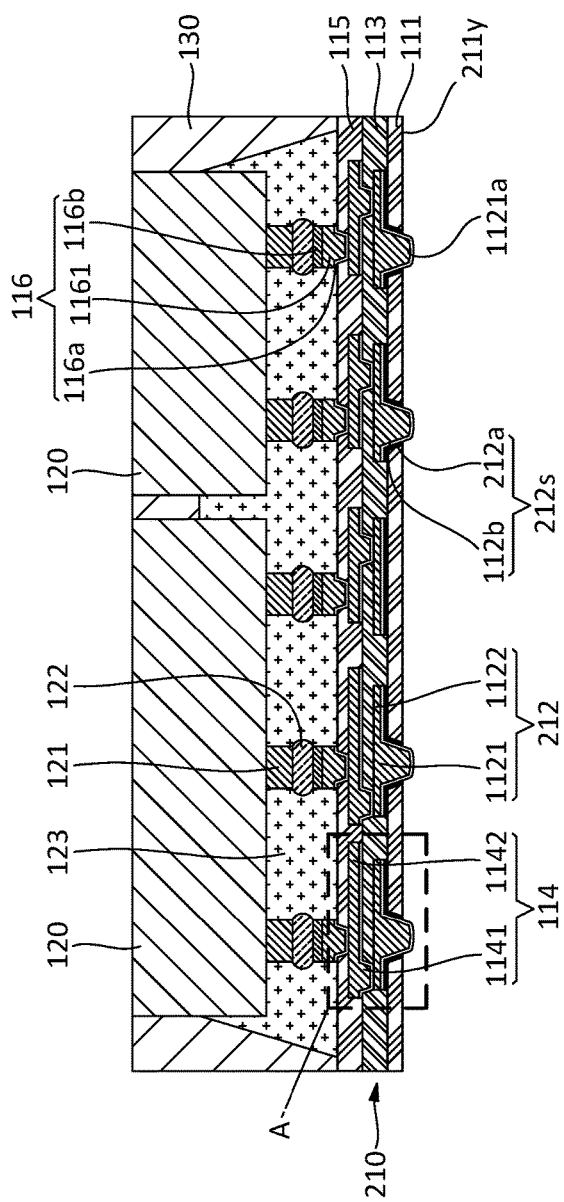
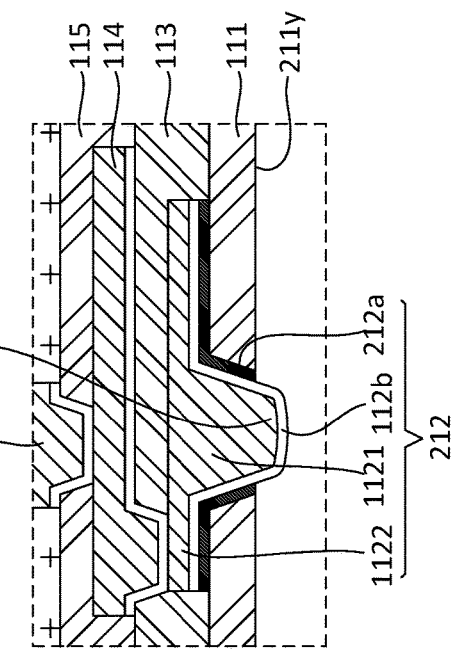
FIG.4B
FIG.4BA

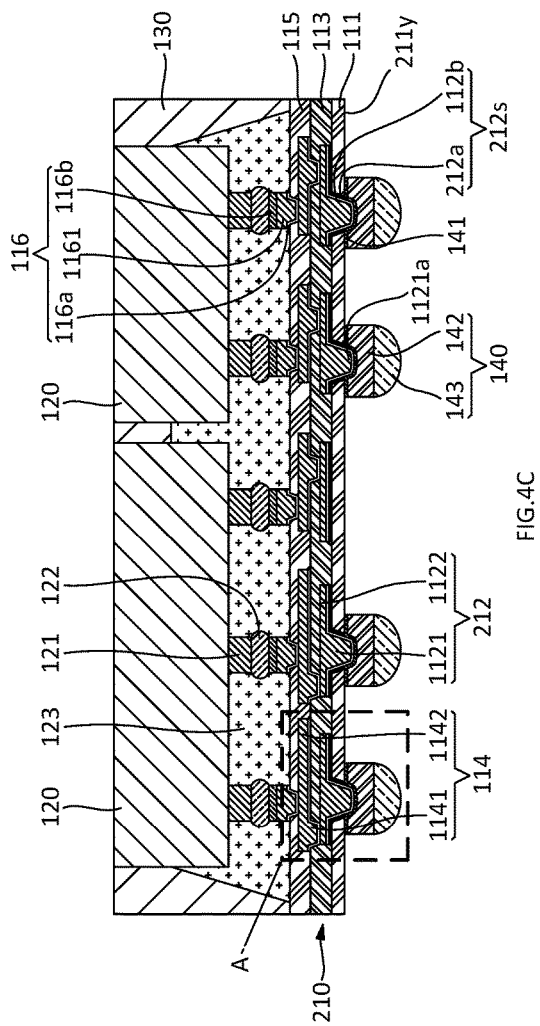
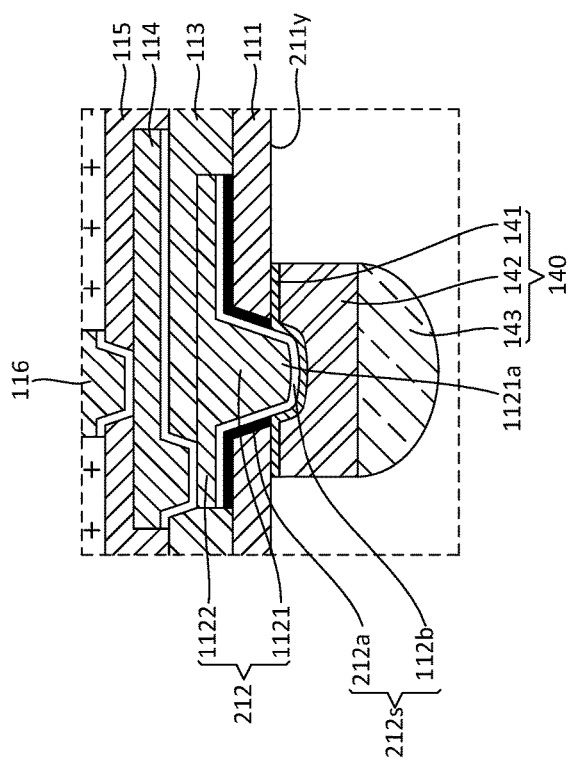

ELECTRONIC DEVICES AND METHODS OF MANUFACTURING ELECTRONIC DEVICES

CROSS-REFERENCE TO RELATED APPLICATIONS

Not applicable.

TECHNICAL FIELD

The present disclosure relates, in general, to electronic devices, and more particularly, to electronic devices and methods for manufacturing electronic devices.

BACKGROUND

Prior electronic packages and methods for forming electronic packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A, 2B, 2C, 2D, 2E, 2F, 2G, 2H, 2I, 2J, 2K, 2KA, 2L, and 2LA show cross-sectional views of an example method for manufacturing an example electronic device.

FIGS. 4A, 4B, 4BA, 4C, and 4CA show cross-sectional views of an example method for manufacturing an example electronic device.

Figure 1:
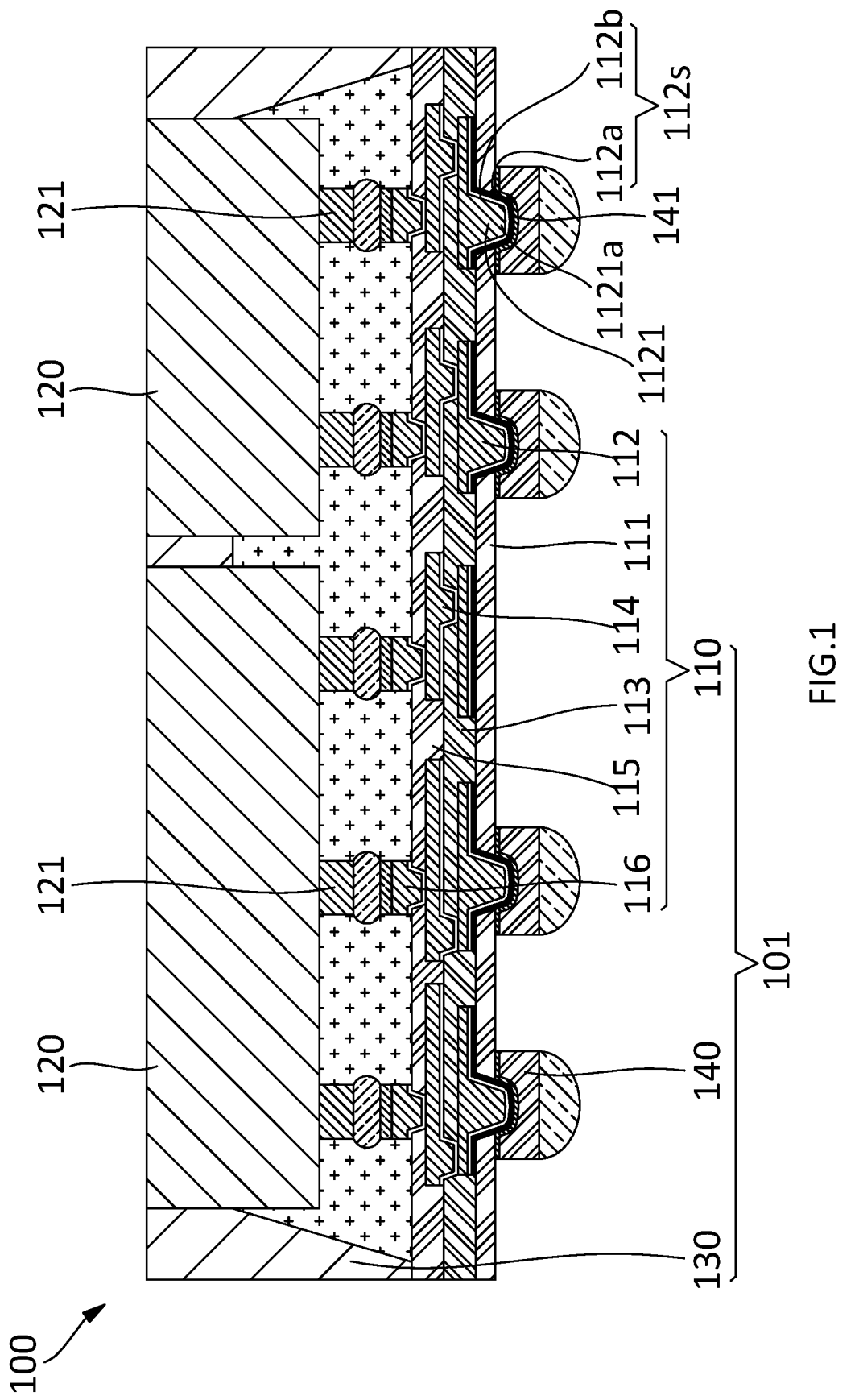
FIG. 1 shows a cross-sectional view of an example electronic device.

The following discussion provides various examples of electronic devices and methods of manufacturing electronic devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly coupled by one or more other elements. For example, if element A is coupled to element B, then element A can be directly contacting element B or indirectly coupled to element B by an intervening element C. Similarly, the terms "over" or "on" may be used to describe two elements directly contacting each other or describe two elements indirectly coupled by one or more other elements.

DESCRIPTION

The present description includes, among other features, devices and associated methods that relate to electronic devices including, for example, semiconductor devices. In some examples, the electronic devices include substrates having protruding via structures, which improve the integrity of interconnect bonding.

In an example, an electronic device includes a substrate including a dielectric structure having a dielectric structure top side and a dielectric structure bottom side opposite to the dielectric structure top side, and a conductive structure comprising a protruded via that extends from the dielectric structure bottom side. An electronic component is coupled to the conductive structure at the dielectric structure top side, and a terminal is coupled to the protruded via such that the protruded via extends into the terminal.

In an example, an electronic device includes a substrate with a dielectric structure having a dielectric structure top side and a dielectric structure bottom side opposite to the dielectric structure top side, wherein the dielectric structure includes a via dielectric that defines the dielectric structure bottom side and the via dielectric comprises an aperture. A conductive structure includes a protruded via within the aperture and having a via tip that extends outward from the dielectric structure bottom side such that the dielectric structure bottom side and the via tip reside on different planes, a seed over surfaces of the aperture between the via dielectric and the protruded via, and a substrate internal terminal at the dielectric substrate top side and coupled to the protruded via. An electronic component is coupled to the substrate internal terminal at the dielectric structure top side and a body encapsulates the electronic component. A terminal is coupled to the protruded via, wherein the via tip extends into the terminal.

In an example, a method for making an electronic device includes providing a substrate having a dielectric structure with a dielectric structure top side and a dielectric structure bottom side opposite to the dielectric structure top side, wherein the dielectric structure includes a via dielectric that defines the dielectric structure bottom side, and the via dielectric comprises an aperture. The substrate includes a conductive structure having a protruded via within the aperture and a via tip that extends outward from the dielectric structure bottom side so that the dielectric structure bottom side and the via tip reside on different planes. The substrate includes a seed over surfaces of the aperture between the via dielectric and the protruded via and a conductor at the dielectric substrate top side and coupled to the protruded via. The method includes coupling an electronic component to the conductor at the dielectric structure top side and providing a body encapsulating the electronic component. The method includes providing a terminal coupled to the protruded via, wherein the via tip extends into the terminal.

Other examples are included in the present disclosure. Such examples may be found in the figures, in the claims, and/or in the description of the present disclosure.

FIG. 1 shows a cross-sectional view of an example electronic device 100. In the example shown in FIG. 1, electronic device 100 can comprise substrate 110, electronic component 120, body 130 and terminal 140.

Substrate 110 can comprise a dielectric structure comprising dielectric 111, 113 and 115, and a conductive structure comprising conductors 112, 114, and 116. Conductor 112 can comprise seed 112s. Dielectrics 111, 113, 115 can each comprise one or more dielectric layers. Conductors 112, 114, 116 can each comprise one or more conductive layers or patterns. Electronic component 120 can comprise component terminals 121. Terminal 140 can comprise terminal seed 141.

Substrate 110, body 130 and terminal 140 can comprise or be referred to as electronic package 101 or package 101. Electronic package 101 can protect the electronic component 120 from exposure to external elements and/or environments. Electronic package 101 can provide an electrical coupling between an external component and electronic component 120.

FIGS. 2A, 2B, 2C, 2D, 2E, 2F, 2G, 2H, 2I, 2J, 2K, 2KA, 2L, and 2LA show cross-sectional views of an example method for manufacturing an example electronic device 100.

Figure 2A:
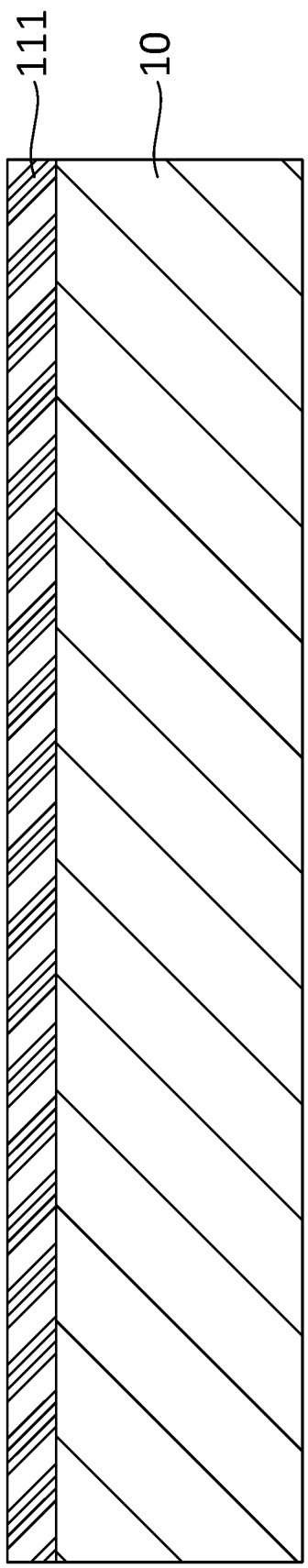

FIG. 2A shows a cross-sectional view of electronic device 100 at an early stage of manufacture. In the example shown in FIG. 2A, dielectric 111 can be provided on the upper side of carrier 10. In some examples, dielectric 111 can comprise or be referred to as a dielectric layer, a coreless dielectric, or a filler-free resin or polymer. In some examples, portions of dielectric 111 can comprise or be referred to as a via dielectric. In some examples, dielectric 111 can comprise an insulating material such as polymer, polyimide (PI), benzocyclobutene (BCB), polybenzoxazole (PBO), bismaleimide triazine (BT), a molding material, a phenolic resin, an epoxy, silicone, or an acrylate polymer. In some examples, dielectric 111 can be formed by spin coating, spray coating, dip coating or rod coating. In some examples, the thickness of dielectric 111 can range from approximately 1 μm (micrometers) to 50 μm.

Carrier 10 can be substantially a planar plate. In some examples, carrier 10 can comprise or be referred to as a board, glass, panel, or strip. For example, carrier 10 can be provided as glass (e.g., soda-lime glass). In some examples, the thickness of carrier 10 can range from approximately 0.3 mm (millimeters) to 2 mm and the width of carrier 10 can range from approximately 100 mm to 300 mm. Carrier 10 can serve to integrally handle components in the process of providing substrate 110, electronic component 120, and body 130. Carrier 10 can be shared in other examples of the present disclosure.

Figure 2B:
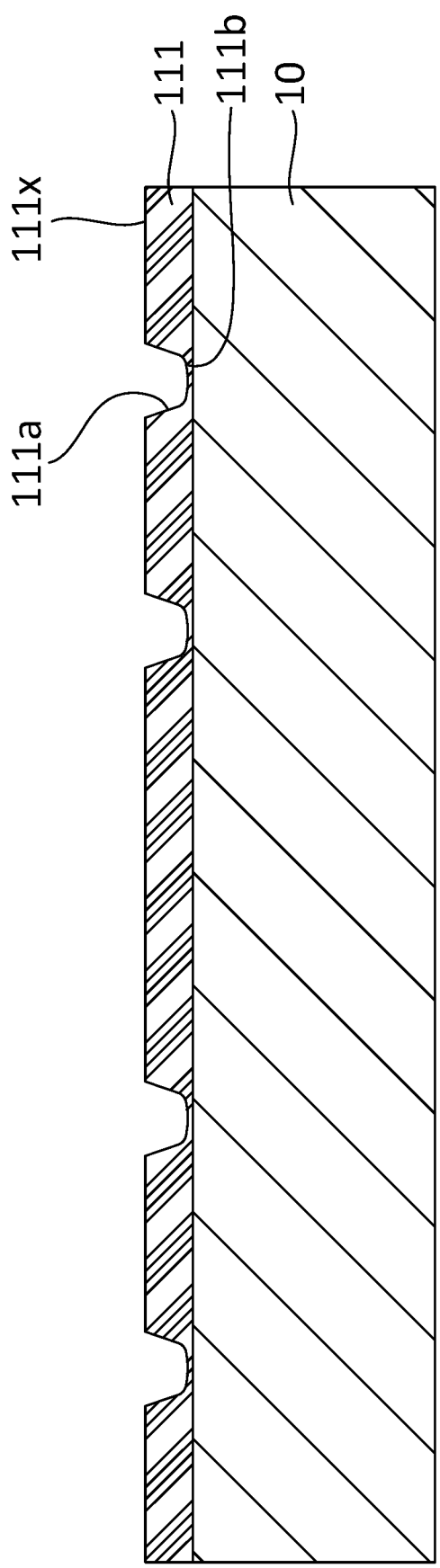

FIG. 2B shows a cross-sectional view of electronic device 100 at a later stage of manufacture. In the example shown in FIG. 2B, aperture 111a having a depth downward from top side 111x of dielectric 111 can be provided. In some examples, after forming a mask pattern on the top side of dielectric 111, aperture 111a can be formed by removing exposed dielectric 111 through etching. Aperture 111a can be formed to be lower than the height of dielectric 111. For example, a portion of dielectric 111 can remain under aperture 111a, and such portion of dielectric 111 can be referred to as lower dielectric 111b. In some examples, aperture 111a can comprise or of be referred to as an opening or a groove. In some examples, lower dielectric 111b can have an upper portion and has a downwardly concave, arcuate, or rounded shape. In some examples, aperture 111a can be formed using wet isotropic etching techniques, plasma etching techniques, or magnetically enhanced reactive ion etching techniques. In some examples, the thickness of lower dielectric 111b can range from approximately 1 μm to 50 μm.

Figure 2C:
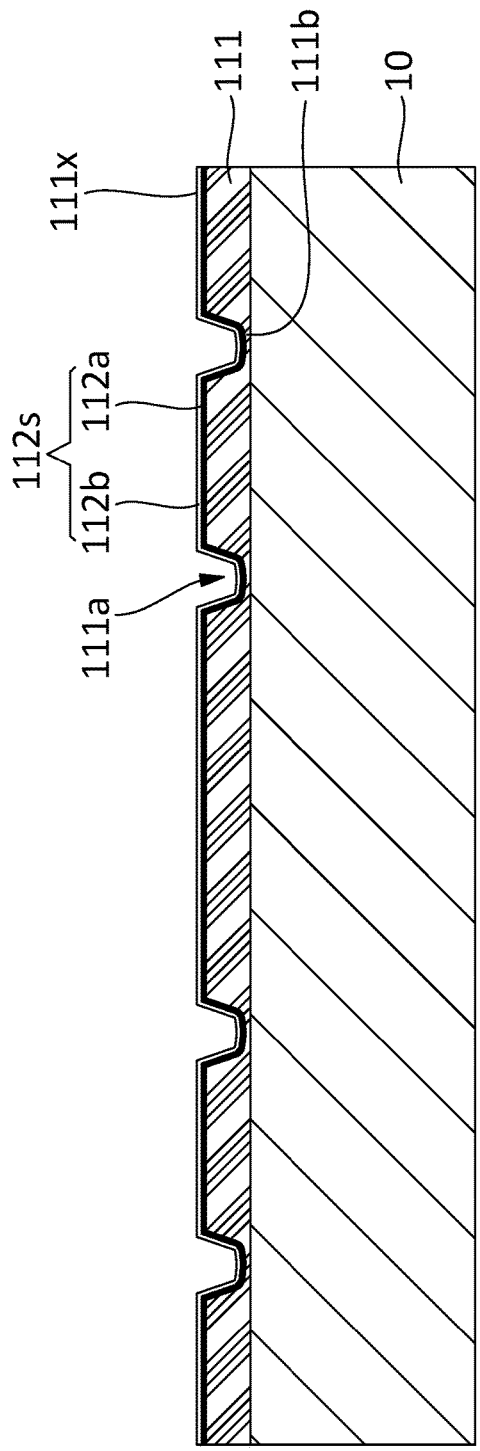

FIG. 2C shows a cross-sectional view of electronic device 100 at a later stage of manufacture. In the example shown in FIG. 2C, seed 112s can be formed on the top side 111x of dielectric 111, on the inner wall of aperture 111a, and on the top side of lower dielectric 111b. Seed 112s can comprise barrier layer 112a covering top side 111x of dielectric 111, the inner wall of aperture 111a, and the upper side of the lower dielectric 111b. Seed 112s can comprise plating seed 112b covering the top side of barrier layer 112a. In some examples, barrier layer 112a or plating seed 112b can comprise one or more conductive layers.

In some examples, barrier layer 112a can comprise a conductor such as titanium (Ti) or titanium tungsten (TiW), and plating seed 112b can comprise another conductor such as copper (Cu). In some examples, the thicknesses of seed 112s can range from approximately 0.05 μm to 6 μm. For example, the thickness of barrier layer 112a can range from approximately 0.05 μm to 3 μm, and the thickness of plating seed 112b can range from approximately 0.05 μm to 3 μm. In some examples, barrier layer 112a or plating seed 112b can be sequentially formed by electroless plating, electrolytic plating, sputtering, physical vapor deposition (PVD), chemical vapor deposition (CVD), metal organic CVD (MOCVD), atomic layer deposition (ALD), low pressure CVD (LPCVD), or plasma-enhanced CVD (PECVD), or other processes as known to one of ordinary skill in the art.

Figure 2D:
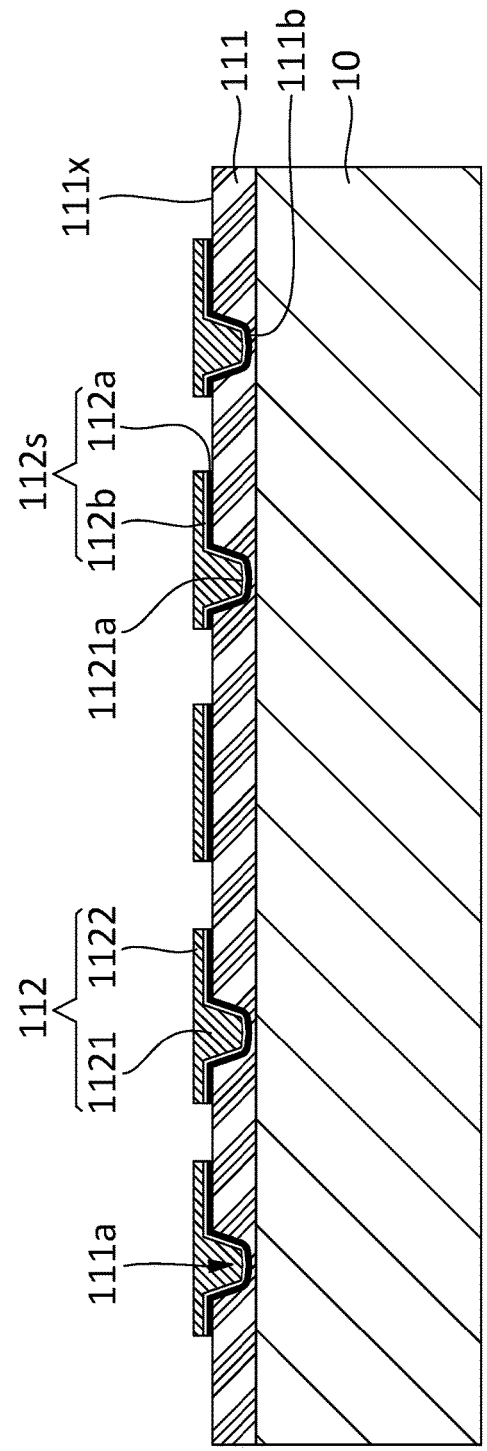

FIG. 2D shows a cross-sectional view of electronic device 100 at a later stage of manufacture. In the example shown in FIG. 2D, conductor 112 can be provided on top sides of seed 112s. Conductor 112 can be processed to have patterns, and each pattern can be defined with respective portions of seed 112s remaining underneath. In some examples, conductor 112 can comprise protruded via 1121 filling aperture 111a, and trace 1122 extending along top side 111x of dielectric 111. Protruded via 1121 can be formed on lower dielectric 111b, and can comprise convex via tip 1121a that is convex from the bottom of dielectric 111. That is, via tip 1121a has a convex shape with respect to the bottom of dielectric 111 in aperture 111a. In some examples, via tip 1121a has an arcuate or rounded shape. Conductor 112 can comprise or be referred to as conductive layers, traces, pads, vias, redistribution layer (RDL), a wiring pattern, or a circuit pattern. In some examples, conductor 112 can comprise copper, gold (Au), silver (Ag), or nickel (Ni). In some examples, conductor 112 can be formed by electroplating. For example, conductor 112 can be formed through plating by using plating seed 112b as a seed after forming a mask pattern so as to cover a portion of the top side of plating seed 112b. For example, a photoresist can be used as the mask pattern, and the mask pattern can be removed after forming conductor 112. Portions of seeds 112s exposed through the mask pattern can be removed by etching, exposing top side 111x of dielectric 111. In some examples, the overall thickness of conductor 112 can range from approximately 1 μm to 50 μm.

FIG. 2E shows a cross-sectional view of electronic device 100 at a later stage of manufacture. In the example shown in FIG. 2E, dielectric 113 can be provided on top side 111x of dielectric 111 and top side 112x of conductor 112. Apertures 113a exposing top side 112x of conductor 112 can be formed through dielectric 113. Dielectric 113 can comprise corresponding elements, features, materials, or methods of manufacture similar to previously described for dielectric 111. For example, the forming of aperture 113a in dielectric 113 can be similar to the forming of aperture 111a in dielectric 111, but aperture 113a can extend fully through the thickness of dielectric 113. Dielectric 113 can expose top side 112x of conductor 112 through aperture 113a.

FIG. 2F shows a cross-sectional view of electronic device 100 at a later stage of manufacture. In the example shown in FIG. 2F, conductor 114 can be provided to cover portions of the top side of dielectric 113 and conductor 112 exposed through aperture 113a. Conductor 114 can comprise corresponding elements, features, materials, or methods of manufacture similar to previously described conductor 112. For example, conductor 114 can comprise plating seed 114a, via 1141, and trace 1142, similar to plating seed 112b, via 1121, and trace 1122 of conductor 112. In some examples, conductor 114 need not comprise a barrier layer similar to barrier layer 112a. Conductor 114 can be coupled to conductor 112 by via 1141 passing through dielectric 113.

Figure 2G:
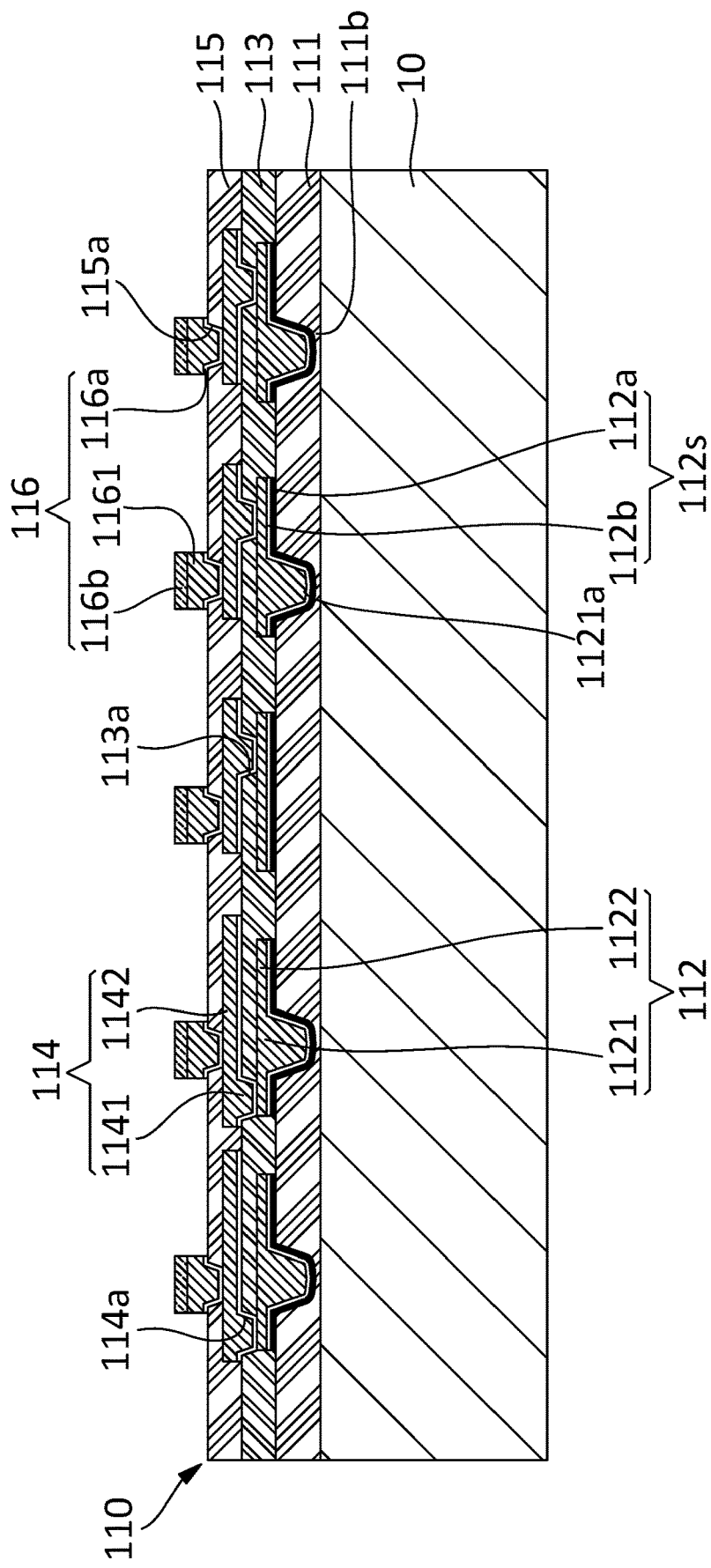

FIG. 2G shows a cross-sectional view of electronic device 100 at a later stage of manufacture. In the example shown in FIG. 2G, dielectric 115 and conductor 116 can be provided on the top side of dielectric 113 and the top side of conductor 114. Dielectric 115 can comprise corresponding elements, features, materials, or methods of manufacture similar to those of previously described dielectric 113. For example, after forming dielectric 115, aperture 115a can be formed similar to aperture 113a. Conductor 116 can comprise corresponding elements, features, materials, or methods of fabrication similar to previously described conductor 114. For example, conductor 116 can comprise plating seed 116a and via 1161, similar to plating seed 114a and via 1141 of conductor 114.

The top side of conductor 116 can comprise conductive cap 116b. Conductive cap 116b can be made of a low-melting-point material. For example, conductive cap 116b can comprise one or more materials such as tin (Sn), Ag, lead (Pb), Cu, Sn—Pb, Sn37-Pb, Sn95-Pb, Sn—Pb—Ag, Sn—Cu, Sn—Ag, Sn—Au, Sn—Bi, Sn—Ag—Cu, or similar materials as known to one of ordinary skill in the art. In some examples, the thickness of conductive cap 116c can range from approximately 1 μm to 50 μm. Conductor 116 can be coupled to conductor 112 through conductor 114. Conductor 116 can comprise or be referred to as substrate internal terminals 116.

Completed substrate 110 can comprise dielectrics 111, 113, and 115, and conductors 112, 114, and 116. Conductor 112 can comprise seed 112s with one or more of plating seed 112b or barrier layer 112a. Conductor 112 can comprise protruded via 1121 and trace 1122. Protruded via 1121 can comprise via tip 1121a and is convex from the bottom of dielectric 111. Although substrate 110 has been described as comprising a three-layer dielectric structure of dielectrics 111, 113, and 115, and a three-layer conductive structures of conductors 112, 114, and 116, the number of conductors or dielectrics can be less or more than three. Substrate 110 can comprise or be referred to as a redistribution layer (RDL) substrate, a buildup substrate, or a coreless substrate.

Substrate 110 is presented as an RDL substrate in the present example. RDL substrates can comprise one or more conductive redistribution layers and one or more dielectric layers and (a) can be formed layer by layer over an electronic device to where the RDL substrate is to be coupled, or (b) can be formed layer by layer over a carrier and can be entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process and can include one or more dielectric layers alternatingly stacked with one or more conductive layers and define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise a conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, and can include a photolithographic mask through where light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, and could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of inorganic dielectric layer(s) can comprise silicon nitride ($Si_3N_4$), silicon oxide ($SiO_2$), and/or SiON. The inorganic dielectric layer(s) can be formed by growing the inorganic dielectric layers using an oxidation or nitridization process instead using photo-defined organic dielectric materials. Such inorganic dielectric layers can be filler-free without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate. Other substrates in this disclosure can also comprise an RDL substrate.

Figure 2H:
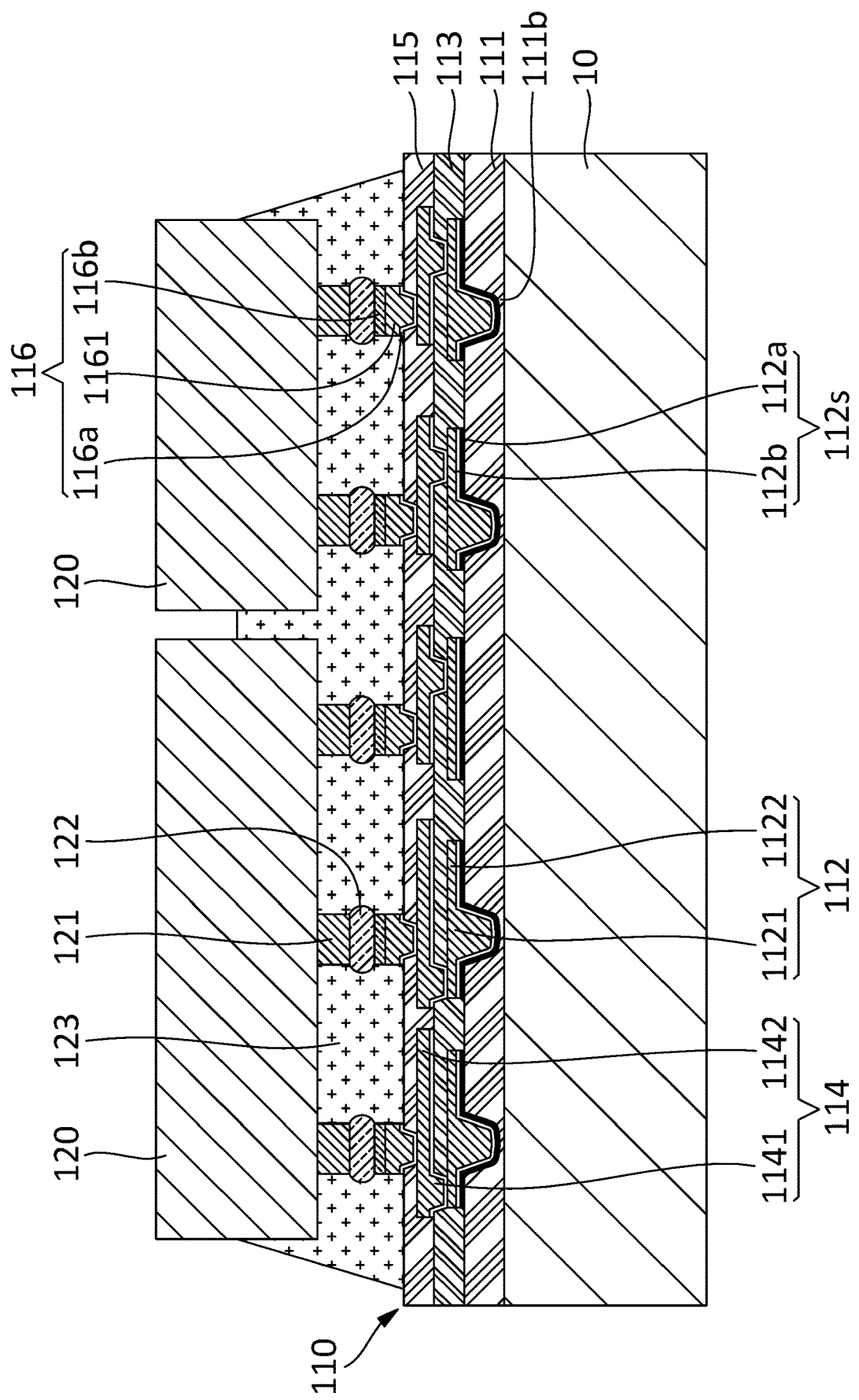

FIG. 2H shows a cross-sectional view of electronic device 100 at a later stage of manufacture. In the example shown in FIG. 2H, electronic component 120 can be provided on substrate 110 coupled substrate internal terminals 116.

In some examples, pick-and-place equipment can pick up electronic component 120 and place it on substrate 110. In some examples, electronic component 120 can be coupled or secured to substrate internal terminal 116 of substrate 110 through a mass reflow, thermal compression, or laser assisted bonding. In some examples, electronic component 120 can be coupled to internal terminals 116 through wire-bonding. In some examples, electronic component 120 can comprise or be referred to as one or more semiconductor dies, semiconductor chips, and semiconductor packages. Although two electronic components 120 are illustrated, the number of electronic components can be less or more than two. As an example, electronic component 120 can comprise a passive or active element.

Electronic component 120 can comprise component terminals 121. Component terminals 121 can be provided spaced apart from each other in row and/or column directions. In some examples, component terminal 121 can comprise or be referred to as a pad, a bump, a pillar, a conductive post, or a solder ball. Component terminals 121 can comprise a conductive material such as aluminum (Al), Cu, Al alloy, or a Cu alloy. Component terminals 121 can be input/output terminals or power terminals of electronic component 120.

Component terminals 121 can comprise a low-melting-point material 122 and can be coupled to substrate internal terminal 116 of substrate 110. As an example, low-melting-point material 122 can comprise one or more of Sn, Ag, Pb, Cu, Sn—Pb, Sn37-Pb, Sn95-Pb, Sn—Pb—Ag, Sn—Cu, Sn—Ag, Sn—Au, Sn—Bi, Sn—Ag—Cu. Component terminal 121 of electronic component 120 and substrate internal terminal 116 of substrate 110 can be coupled to each other by low-melting-point material 122. The overall thickness of electronic component 120 can range from approximately 100 μm to 800 μm.

In some examples, underfill 123 can be between electronic component 120 and substrate 110. Underfill 123 can comprise or be referred to as a dielectric layer or a non-conductive paste, and can be an inorganic-filler-free resin. In some examples, after electronic component 120 is coupled to base substrate 110, underfill 123 can be inserted into a gap between electronic component 120 and substrate 110 and then cured. In some examples, after underfill 123 is dispensed to cover substrate internal terminal 116 of substrate 110, component terminal 121 of electronic component 120 and low-melting-point material 122 penetrate through underfill 123 and can be coupled to substrate internal terminal 116. Underfill 123 can prevent electronic component 120 from being separated from base substrate 110 caused by physical impact or chemical impact.

Although electronic component 120 is shown coupled to internal terminals 116 face-down or in a flip-chip configuration, there can be examples where electronic component 120 can be coupled to internal terminals 116 face-up or in a wirebond configuration.

Figure 2I:
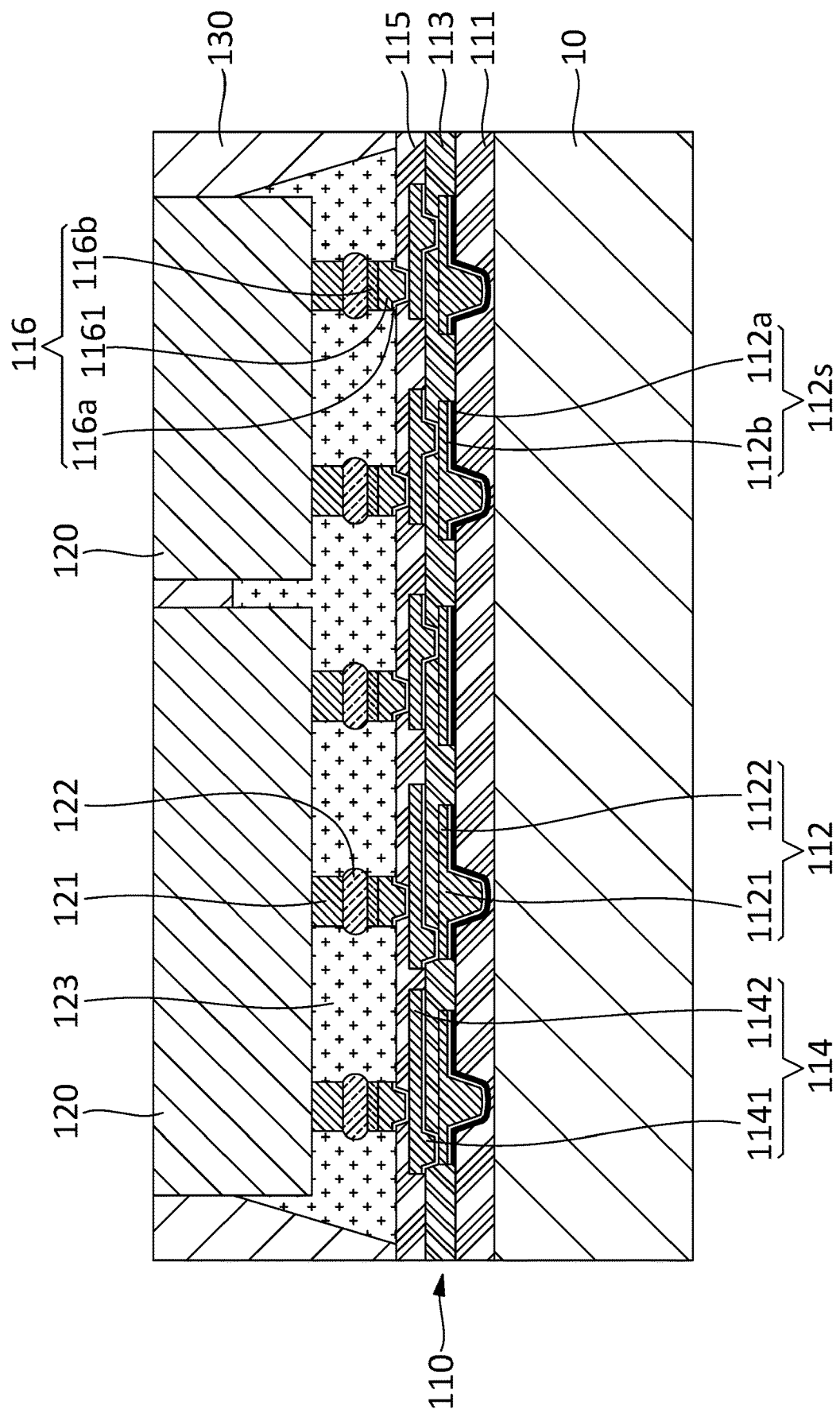

FIG. 2I shows a cross-sectional view of electronic device 100 at a later stage of manufacture. In the example shown in FIG. 2I, body 130 can be provided to cover substrate 110 and electronic component 120. In some examples, body 130 can be in contact with top side of substrate 110 and lateral sides of electronic component 120. In some examples, top side 120x of electronic component 120 can be optionally exposed from body 130.

In some examples, body 130 can comprise or be referred to as an encapsulant, a molding, or a lid. In some examples, when body 130 is an encapsulant or a molding, body 130 can comprise an organic resin, an inorganic filler, a curing agent, a catalyst, a coupling agent, a colorant, or a flame retardant, and can be formed by compression molding, transfer molding, liquid body molding, vacuum lamination, paste printing, film assist molding, or other processes as known to one of ordinary skill in the art. After body 130 is provided to cover top side of substrate 110 and the upper side and lateral sides of electronic component 120, the upper portion of body 130 can be removed to expose the top side of electronic component 120. Body 130 can be removed by a general grinding or chemical etching process. In some examples, when body 130 is a lid, body 130 can be adhered and fixed to the top side of substrate 110 through an adhesive. The thickness of body 130 can range from approximately 0.1 mm to 1 mm. Body 130 can protect substrate 110 and electronic component 120 from external elements.

Figure 2J:
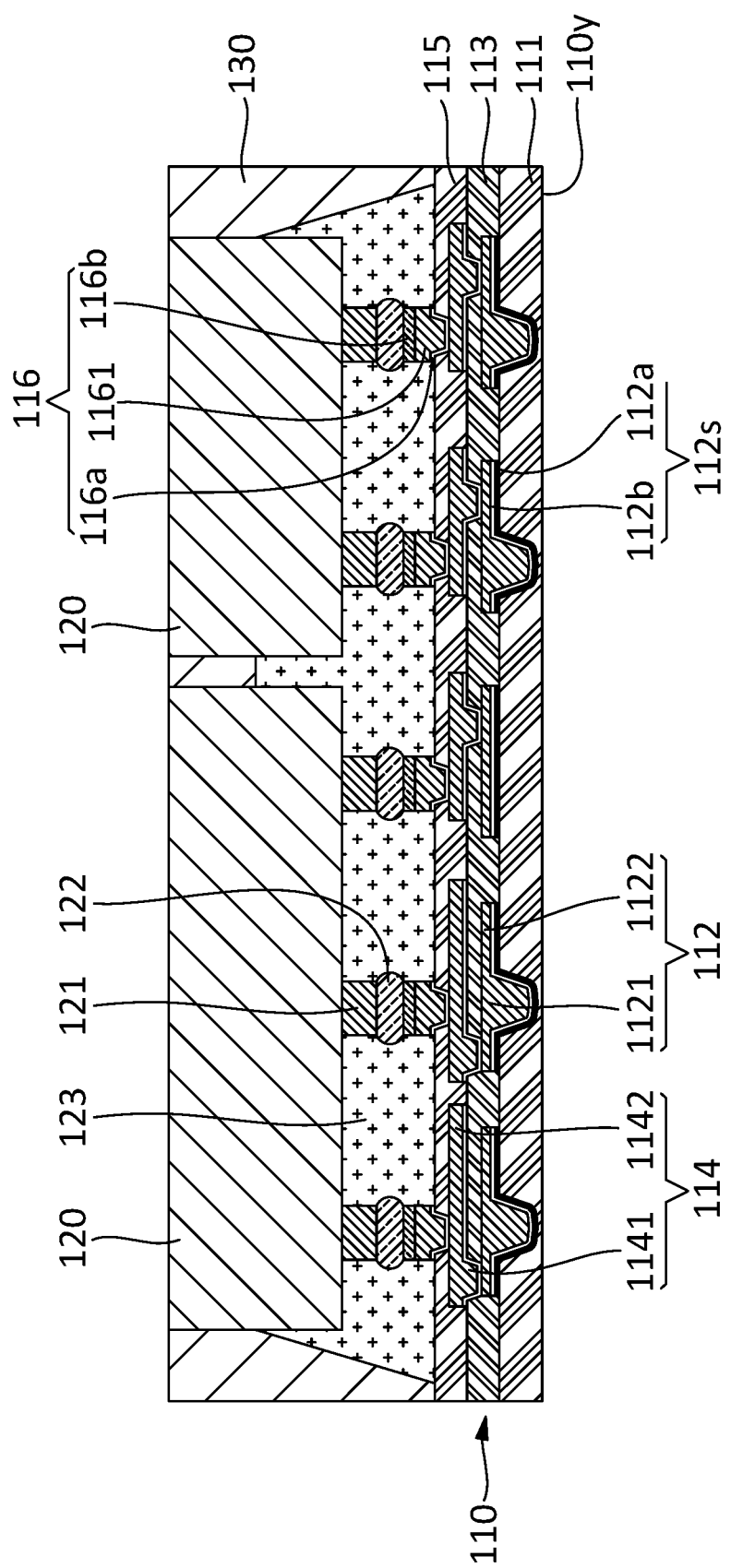

FIG. 2J shows a cross-sectional view of electronic device 100 at a later stage of manufacture. In the example shown in FIG. 2J, carrier 10 can be removed from bottom side 110y of substrate 110. In some examples, carrier 10 can be removed by grinding, twisting, or pulling. Since dielectric 111 is positioned on bottom side of substrate 110, it is possible to prevent conductor 112 from being damaged by heat provided when carrier 10 is removed. Since dielectric 111 is located on the bottom side of substrate 110, substrate 110 and carrier 10 can be separated by laser irradiation even without a temporary adhesive layer, where adhesive force can be lowered due to light or heat.

FIGS. 2K and 2KA show cross-sectional views of electronic device 100 at a later stage of manufacture. FIG. 2KA is an enlarged view showing a portion A of FIG. 2K. In the example shown in FIGS. 2K and 2KA, conductor 112 can be exposed at bottom side 111y of substrate 110 by removing lower dielectric 111b of dielectric 111 from substrate 110. Protruded via 1121 can protrude downward from bottom side 111y of dielectric 111 of substrate 110. For example, via tip 1121a of protruded via 1121 can protrude to be lower than bottom side 111y of dielectric 111. In some examples, via tip 1121a can remain covered by seeds 112s, such as by plating seed 112b or barrier layer 112a. For example, via barrier layer 112a surrounding via tip 1121a can be exposed from substrate bottom side 111y. In some examples, lower dielectric 111b can be removed by a chemical etching process. For example, lower dielectric 111b can be removed by using oxygen ($O_2$), carbon tetrafluoride ($CF_4$), or argon (Ar) plasma. The height of downwardly protruded via tip 1121a from dielectric 111 can range from approximately 0.5 μm to 5 μm. As illustrated in FIGS. 2K and 2KA, protruded via 1121 extends outward from bottom side 111y of dielectric 111 so that bottom side 111y and via tip 1121a reside on different planes.

FIG. 2L shows a cross-sectional view of electronic device 100 at a later stage of manufacture. In the example shown in FIG. 2L, terminal 140 can be provided coupled to conductor 112 of substrate 110. For example, terminal 140 can contact seed 112s or via tip 1121a of protruded via 1121 to be coupled to conductor 112. Terminal 140 can be coupled to electronic component 120 through conductors 112, 114, and 116 of substrate 110. Protruded via tip 1121a can extend into terminal 140. In some examples, terminal 140 can comprise or be referred to as a pillar, a solder tip, a bump, a solder ball. In some examples, terminal 140 can comprise Sn, Ag, Pb, Cu, Sn—Pb, Sn37-Pb, Sn95-Pb, Sn—Pb—Ag, Sn—Cu, Sn—Ag, Sn—Au, Sn—Bi, or Sn—Ag—Cu.

In some examples, terminal 140 can comprise or be referred to as a conductive post where solder cap 143 is formed on conductive pillar 142. For example, terminal 140 can comprise terminal seed 141, and be formed to uniformly cover the bottom side of substrate 110 and via tip 1121a of protruded via 1121. Terminal seed 141 can comprise corresponding elements, features, or methods of fabrication similar to plating seed 112b of previously described conductor 112. In some examples, terminal seed 141 can comprise Ti/Cu or TiW/Cu. Terminal seed 141 can comprise one or more layers. Conductive pillar 142 of terminal 140 can be formed by plating using terminal seed 141 as a seed. After forming conductive pillar 142, unwanted portions of terminal seed 141 can be removed by using conductive pillar 142 as a mask. Conductive pillar 142 can cover via tip 1121a protruding from substrate 110. Protruded via tip 1121a extends into conductive pillar 142 so that protruded via tip 1121a is embedded within conductive pillar 142. Seed 112s and terminal seed 141 can be interposed between via tip 1121a of conductor 112 and conductive pillar 142 of terminal 140. Solder cap 143 can be formed on the bottom side of conductive pillar 142 by plating or through a ball drop, followed by a reflow process. In some examples, the height of terminal 140 can range from approximately 50 µm to 250 µm.

In some examples, a singulation process through substrate 110 and body 130 can be carried out to separate individual electronic devices 100.

Figure 3:
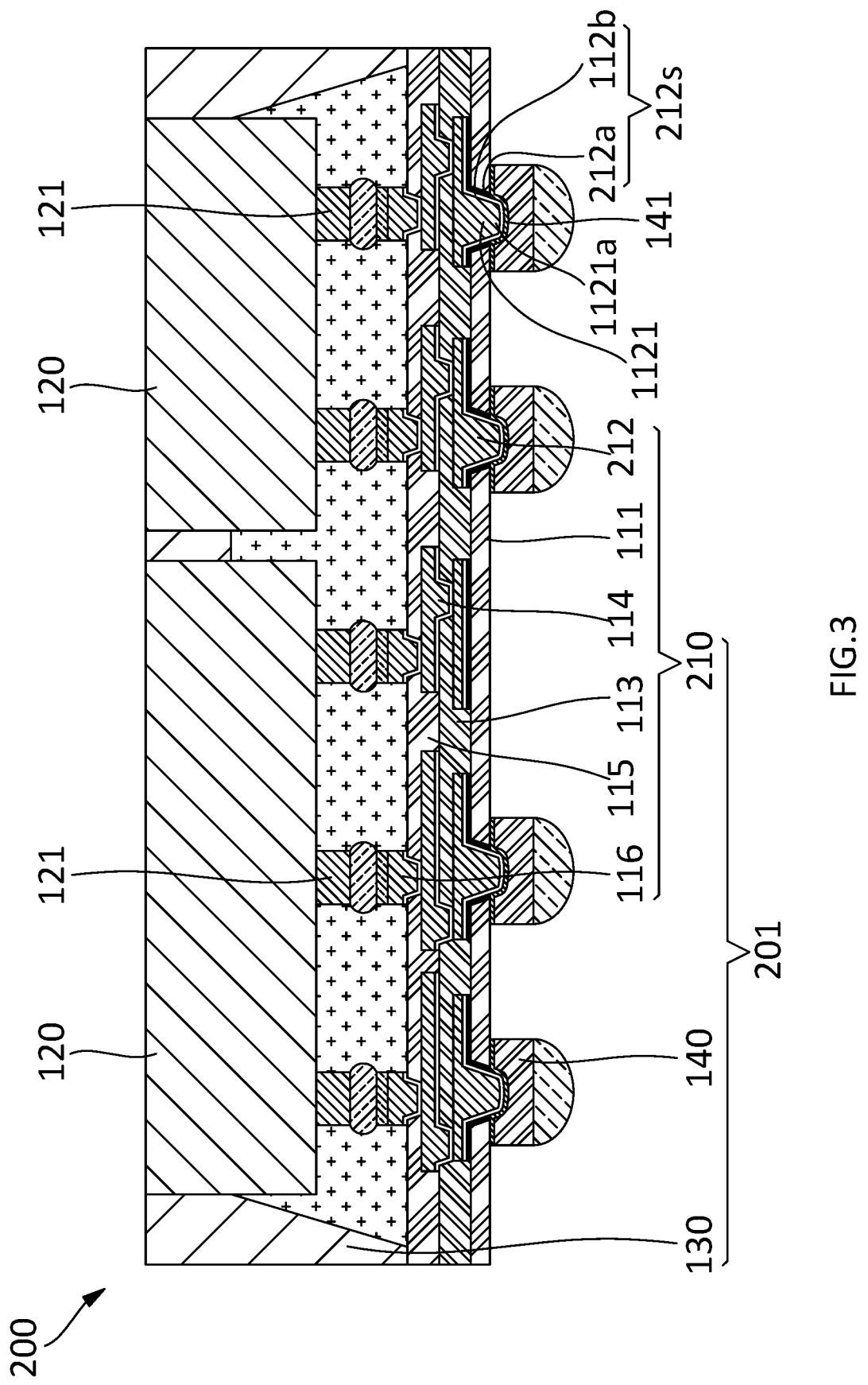
FIG. 3 shows a cross-sectional view of an example electronic device.

FIG. 3 shows a cross-sectional view of an example electronic device 200. In the example shown in FIG. 3, electronic device 200 can comprise substrate 210, electronic component 120, body 130, and terminal 140.

Electronic device 200 can be similar to previously described electronic device 100. For example, electronic component 120, body 130 and terminal 140 of electronic device 200 can be similar as described for electronic device 100 of FIGS. 1-2. Dielectrics 111, 113, and 115 and conductors 212, 114, and 116 of substrate 210 of electronic device 200 can be similar to corresponding ones of substrate 110 of electronic device 100. Conductor 212 can comprise seed 212s that can be similar to seed 112s previously described. Like seed 112s, seed 212s can comprise plating seed 112b, and can also comprise barrier layer 212a that can be similar to barrier layer 112a but need not cover the bottom of via tip 1121a.

Substrate 210, body 130, and terminal 240 can comprise or be referred to as an electronic package 201 or package 201.

Figure 4A:
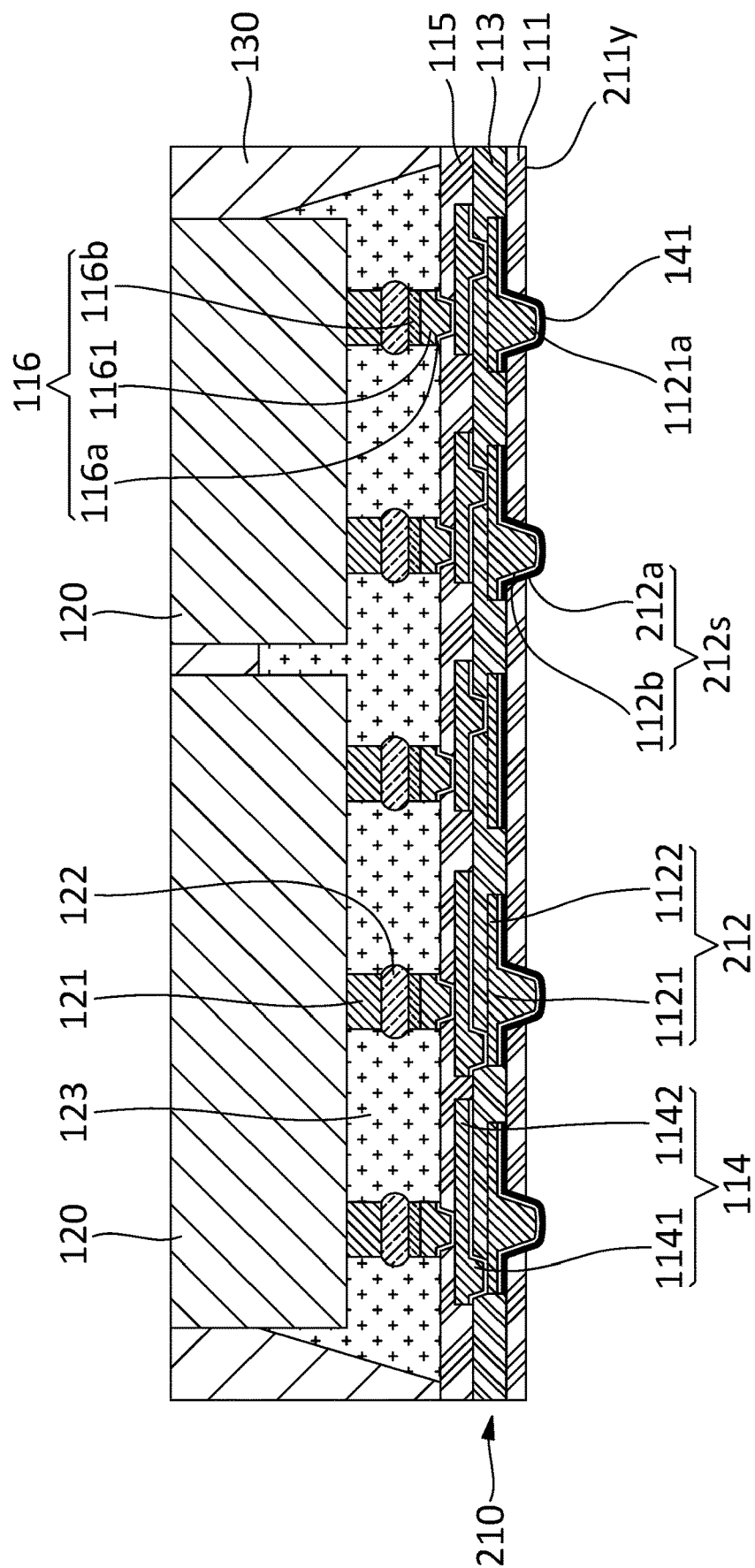

FIGS. 4A, 4B, 4BA, 4C, and 4CA show cross-sectional views of an example method for manufacturing an example electronic device 200.

FIG. 4A shows a cross-sectional view of electronic device 200 at an early stage of manufacture. In the example shown in FIG. 4A, electronic device 200 can be prepared. Electronic device 200 shown in FIG. 4A can be similar to electronic device 100 as described with respect to FIGS. 2A to 2K.

Substrate 210 can comprise conductor 212 similar to conductor 112 previously described. Conductor 212 can comprise seed 212s having one or more of barrier layer 212a or plating seed 112b. In some examples, barrier layer 212a can comprise a dielectric, such as an oxide or a nitride like $SiO_2$ or SiN, and plating seed 112b can comprise a conductor such as Cu. In some examples, the thickness of barrier layer 212a can range from approximately 0.05 µm to 3 µm, and the thickness of plating seed 112b can range from approximately 0.05 µm to 3 µm. In some examples, barrier layer 212a and plating seed 112b can be sequentially formed. Barrier layer 212a can be formed by PVD, CVD, PECVD or ALD. Plating seed 112b can be formed by sputtering, CVD, MOCVD or PVD.

FIGS. 4B and 4BA show cross-sectional views of electronic device 200 at a later stage of manufacture. FIG. 4BA is an enlarged view showing a portion A of FIG. 4B.

In the example shown in FIGS. 4B and 4BA, removal of via barrier layer 212a covering via tip 1121a of protruded via 1121 of substrate 210 is shown, such that via tip 1121a and plating seed 112b can be exposed at bottom side 211y of substrate 210.

Via barrier layer 212a can remain interposed between the inner wall of aperture 111a of dielectric 111 and protruded via 1121 of conductor 112. For example, via barrier layer 212a can remain interposed between the inner wall of aperture 111a of dielectric 111 and plating seed 112b surrounding protruded via 1121 of conductor 112. In some examples, via barrier layer 212a covering via tip 1121a can be removed by a chemical etching process. For example, via barrier layer 212a can be removed by a physical etching process using Ar plasma or a chemical etching process using nitric acid, hydrochloric acid, or hydrofluoric acid. In some examples, plating seed 112b covering via tip 1121a can also be removed to expose via tip 1121a. As illustrated in FIGS. 4B and 4BA, protruded via 1121 extends outward from bottom side 111y of dielectric 111 so that bottom side 111y and via tip 1121a reside on different planes.

FIGS. 4C and 4CA show cross-sectional views of electronic device 200 at a later stage of manufacture. In the example shown in FIGS. 4C and 4CA, terminal 140 can be provided coupled to conductor 112 of substrate 210. For example, terminal 140 can be coupled to via tip 1121a of protruded via 1121 of conductor 212. Protruded via tip 1121a can extend into terminal 140 so that protruded via tip 1121a is embedded within terminal 140.

Terminal 140 can comprise corresponding elements, features, materials, or methods of manufacture similar to those of those previously described for FIG. 2L. For example, terminal 140 can comprise terminal seed 141, conductive pillar 142 or solder cap 143. In some examples, terminal seed 141 of terminal 140 can be coupled with via tip 1121a or seed 212s covering via tip 1121a. In some examples, plating seed 112b can be interposed between terminal seed 141 of terminal 140 and via tip 1121a.

In some examples, a singulation process through substrate 210 and body 130 can be carried out to separate individual electronic devices 200.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. An electronic device, comprising:
   a substrate comprising:
      a dielectric structure comprising a dielectric structure top side and a dielectric structure bottom side opposite to the dielectric structure top side; and
      a conductive structure comprising a protruded via that extends outward from the dielectric structure bottom side;
   an electronic component coupled to the conductive structure at the dielectric structure top side; and
   a terminal coupled to the protruded via such that the protruded via extends into the terminal;
   wherein:
      the dielectric structure comprises a via dielectric comprising a via dielectric bottom side that defines the dielectric structure bottom side and a via dielectric top side opposite to the via dielectric bottom side;
      the via dielectric comprises an aperture that extends from the via dielectric top side to the via dielectric bottom side;

the protruded via is within the aperture;
a portion of the protruded via extends out of the aperture at the via dielectric top side and overlaps onto via dielectric top side;
the conductive structure comprises a seed along sidewalls of the aperture;
the protruded via comprises a via tip that extends from the dielectric structure bottom side;
the seed is interposed between the sidewalls of the aperture and the protruded via;
the seed comprises a barrier layer and a first plating seed interposed between the barrier layer and the protruded via; and
the first plating seed extends outside of the aperture and covers the via tip.

2. The electronic device of claim 1, further comprising:
a second plating seed interposed between the first plating seed and the terminal, wherein:
the second plating seed extends along a portion of the dielectric structure bottom side.

3. The electronic device of claim 1, wherein:
the barrier layer comprises a dielectric; and
the via tip is devoid of the barrier layer.

4. The electronic device of claim 1, wherein:
the barrier layer comprises a conductor; and
the barrier layer covers the via tip.

5. The electronic device of claim 1, wherein:
the protruded via comprises a via tip comprising a rounded shape.

6. The electronic device of claim 5, wherein:
the terminal comprises a pillar and a solder tip; and
the via tip extends into the pillar.

7. The electronic device of claim 1, wherein:
the dielectric structure comprises a first dielectric comprising a first dielectric top side and a first dielectric bottom side;
the first dielectric bottom side contacts the via dielectric top side; and
the first dielectric bottom side contacts the portion of the protruded via that overlaps onto the via dielectric top side.

8. The electronic device of claim 1, wherein:
the substrate comprises a redistribution layer (RDL) substrate;
the dielectric structure comprises a plurality of dielectric layers; and
the conductive structure comprises traces embedded between the plurality of dielectric layers.

9. The electronic device of claim 1, further comprising:
a body over the dielectric structure top side and covering at least portions of the electronic component.

10. An electronic device, comprising:
a substrate comprising:
a dielectric structure comprising a dielectric structure top side and a dielectric structure bottom side opposite to the dielectric structure top side, wherein:
the dielectric structure comprises:
a via dielectric comprising a via dielectric bottom side that defines the dielectric structure bottom side and via dielectric top side opposite to the via dielectric bottom side; and
a first dielectric comprising a first dielectric top side and a first dielectric bottom side that contacts the via dielectric top side; and
the via dielectric comprise an aperture that extends from the via dielectric top side to the via dielectric bottom side;
and
a conductive structure comprising:
a protruded via within the aperture and comprising a via tip that extends outward from the dielectric structure bottom side such that the dielectric structure bottom side and the via tip reside on different planes and a portion of the protruded via extends outside of the aperture to overlap the via dielectric top side;
a seed over the via tip and over surfaces of the aperture between the via dielectric and the protruded via; and
a substrate internal terminal at the dielectric structure top side and coupled to the protruded via;
wherein:
the first dielectric bottom side contacts the portion of the protruded via overlapping the via dielectric top side;
an electronic component coupled to the substrate internal terminal at the dielectric structure top side;
a body encapsulating the electronic component; and
a terminal coupled to the protruded via;
wherein:
the via tip extends into the terminal.

11. The electronic device of claim 10, wherein:
the seed comprises a barrier and a seed layer;
the seed layer is interposed between the barrier and the protruded via; and
the seed layer covers the via tip.

12. The electronic device of claim 10, wherein:
a surface of the electronic component is exposed from the body.

13. The electronic device of claim 10, wherein:
the protruded via comprises a plated material;
the via tip comprises a side surface exposed from the via dielectric; and
the terminal comprises:
a terminal seed covering the via tip including the side surface of the via tip; and
a bump over the terminal seed.

14. The electronic device of claim 10, wherein:
the electronic component comprises a component terminal;
the component terminal is attached to the substrate internal terminal; and
the electronic device comprises an underfill between the component terminal and the substrate internal terminal.

15. A method for making an electronic device, comprising:
providing a substrate comprising:
a dielectric structure comprising a dielectric structure top side and a dielectric structure bottom side opposite to the dielectric structure top side, wherein:
the dielectric structure comprises a via dielectric that defines the dielectric structure bottom side; and
the via dielectric comprises an aperture;
and
a conductive structure comprising:
a protruded via within the aperture and comprising a via tip that extends outward from the dielectric structure bottom side so that the dielectric structure bottom side and the via tip reside on different planes;
a seed over surfaces of the aperture between the via dielectric and the protruded via; and
a conductor at the dielectric structure top side and coupled to the protruded via;

coupling an electronic component to the conductor at the dielectric structure top side;
providing a body encapsulating the electronic component; and
providing a terminal coupled to the protruded via; wherein:
the via tip extends into the terminal; and
providing the substrate comprises:
providing the via dielectric comprising a height;
providing the aperture in the via dielectric, wherein the aperture has a depth less than the height to define a lower dielectric under the aperture;
providing the seed over the surfaces of the aperture;
providing the protruded via over the seed and within the aperture; and
removing a portion of the via dielectric including the lower dielectric to expose the via tip and define the dielectric structure bottom side.

16. The method of claim 15, wherein:
providing the substrate comprises:
providing a carrier comprising an upper side;
providing the via dielectric over the upper side of the carrier; and
removing the carrier before removing the portion of the via dielectric.

17. The method of claim 15, wherein:
providing the substrate comprises providing the seed comprising a barrier and a seed layer over the barrier; and
the barrier and the seed layer cover the via tip.

18. The method of claim 15, wherein:
providing the substrate comprises providing the seed comprising a barrier and a seed layer over the barrier; and
the seed layer is over the via tip but at least a portion of the via tip is exposed from the barrier.

19. An electronic device, comprising:
a substrate comprising:
a dielectric structure comprising a dielectric structure top side and a dielectric structure bottom side opposite to the dielectric structure top side; and
a conductive structure comprising a protruded via that extends outward from the dielectric structure bottom side;
an electronic component coupled to the conductive structure at the dielectric structure top side; and
a terminal coupled to the protruded via such that the protruded via extends into the terminal;
wherein:
the dielectric structure comprises a via dielectric comprising a via dielectric bottom side that defines the dielectric structure bottom side and a via dielectric top side opposite to the via dielectric bottom side;
the via dielectric comprises an aperture that extends from the via dielectric top side to the via dielectric bottom side;
the protruded via is within the aperture;
a portion of the protruded via extends out of the aperture at the via dielectric top side and overlaps onto via dielectric top side;
the protruded via comprises a via tip comprising a rounded shape;
the terminal comprises a pillar and a solder tip; and
the via tip extends into the pillar.

20. The electronic device of claim 19, wherein:
the conductive structure comprises a seed along sidewalls of the aperture;
the protruded via comprises a via tip that extends from the dielectric structure bottom side; and
the seed is interposed between the sidewalls of the aperture and the protruded via.

21. The electronic device of claim 20, wherein:
the seed comprises a barrier and a first plating seed interposed between the barrier and the protruded via; and
the first plating seed extends outside of the aperture and covers the via tip.

22. The electronic device of claim 21, further comprising:
a second plating seed interposed between the first plating seed and the terminal, wherein:
the second plating seed extends along a portion of the dielectric structure bottom side.

23. The electronic device of claim 21, wherein:
the barrier layer comprises a dielectric; and
the via tip is devoid of the barrier.

* * * * *